(12) United States Patent
Dubey et al.

(10) Patent No.: US 9,230,833 B2
(45) Date of Patent: Jan. 5, 2016

(54) METHODS TO PREVENT FILLER ENTRAPMENT IN MICROELECTRONIC DEVICE TO MICROELECTRONIC SUBSTRATE INTERCONNECTION STRUCTURES

(71) Applicant: INTEL CORPORATION, Santa Clara, CA (US)

(72) Inventors: Manish Dubey, Chandler, AZ (US); Rajendra C. Dias, Phoenix, AZ (US); Yonghao Xiu, Chandler, AZ (US); Arjun Krishnan, Chandler, AZ (US); Yiqun Bai, Chandler, AZ (US); Purushotham Kaushik Muthur Srinath, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/638,328

(22) Filed: Mar. 4, 2015

(65) Prior Publication Data

US 2015/0179479 A1 Jun. 25, 2015

Related U.S. Application Data

(62) Division of application No. 13/925,967, filed on Jun. 25, 2013, now Pat. No. 8,999,765.

(51) Int. Cl.
*H01L 21/56* (2006.01)
*H01L 23/00* (2006.01)

(52) U.S. Cl.
CPC .............. *H01L 21/563* (2013.01); *H01L 23/00* (2013.01); *H01L 2924/0002* (2013.01)

(58) Field of Classification Search
CPC ...................................................... H01L 21/563
See application file for complete search history.

(56) References Cited

U.S. PATENT DOCUMENTS

| 8,999,765 | B2 | 4/2015 | Dubey et al. |
| 2002/0040970 | A1 | 4/2002 | Lee et al. |
| 2013/0026360 | A1 | 1/2013 | Stoermer |
| 2013/0161822 | A1 | 6/2013 | Barbeau et al. |

OTHER PUBLICATIONS

Feger, et al. "The Over-Bump Applied Resin Wafer-Level Underfill Process: Process, Material and Reliability", Electronic Components and Technology Conference, 2009, pp. 1502-1505.

*Primary Examiner* — Mamadou Diallo
(74) *Attorney, Agent, or Firm* — Winkle, PLLC

(57) ABSTRACT

Embodiments of the present description include methods for attaching a microelectronic device to a microelectronic substrate with interconnection structures after disposing of an underfill material on the microelectronic device, wherein filler particless within the underfill material may be repelled away from the interconnection structures prior to connecting the microelectronic device to the microelectronic structure. These methods may include inducing a charge on the interconnection structures and may include placing the interconnection structures between opposing plates and producing a bias between the opposing plates after depositing the underfill material on the interconnection structures.

16 Claims, 5 Drawing Sheets

METHODS TO PREVENT FILLER ENTRAPMENT IN MICROELECTRONIC DEVICE TO MICROELECTRONIC SUBSTRATE INTERCONNECTION STRUCTURES

CROSS REFERENCE TO RELATED APPLICATIONS

The present application claims priority to U.S. patent application Ser. No. 13/925,967, filed Jun. 25, 2013.

TECHNICAL FIELD

Embodiments of the present description generally relate to the field of microelectronic device packaging, and, more specifically, to methods for attaching a microelectronic device to a microelectronic substrate with interconnection structures after disposing of an underfill material on the microelectronic device.

BACKGROUND ART

The microelectronic industry is continually striving to produce ever faster and smaller microelectronic devices for use in various mobile electronic products, such as portable computers, electronic tablets, cellular phones, digital cameras, and the like. As these goals are achieved, packaging of the microelectronic devices becomes more challenging. A typical microelectronic package includes at least one microelectronic device that is mounted on a microelectronic substrate such that bond pads, or other such electrical attachment structure, on the microelectronic device are attached directly to corresponding bond lands, or other such electrical attachment structure, on the microelectronic substrate with interconnection structures. To enhance the reliability of the connection between the microelectronic device bond pads and the substrate bond lands, an underfill material may be deposed between the microelectronic device and the microelectronic substrate for mechanical reinforcement. Underfill materials are generally low viscosity materials, such as low viscosity epoxy materials, which may be dispensed from a dispensing needle along at least one edge of the microelectronic device. The underfill material is drawn between the microelectronic device and the microelectronic substrate by capillary action, and the underfill material is subsequently cured (hardened). However, the reduction in the size of the gap between the microelectronic device and the microelectronic substrate, the reduction of the interconnection structure pitch, and the constraints with regard to keep-out zones make standard underfilling techniques challenging. Thus, the industry is moving toward wafer level attachment techniques, wherein the underfill material is disposed on an active surface of the microelectronic device to cover the interconnection structures. The interconnection structures are then brought into contact with the microelectronic substrate bond lands during the attachment process, thereby "pushing" the underfill material out of the way. However, such underfill materials are generally comprised of a resin material with filler particles dispersed therein. The filler particles are used to lower the coefficient of thermal expansion mismatch between the underfill material and the microelectronic device and/or the microelectronic substrate. During the attachment process, filler particles may get trapped between the microelectronic device interconnection structures and the microelectronic substrate bond lands, which may result in the reliability issues and/or reduce the current carrying capacity of the connection, as will be understood to those skilled in the art. Therefore, there is an ongoing effort to develop ever more effective techniques to dispose an underfill material between a microelectronic device and the microelectronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
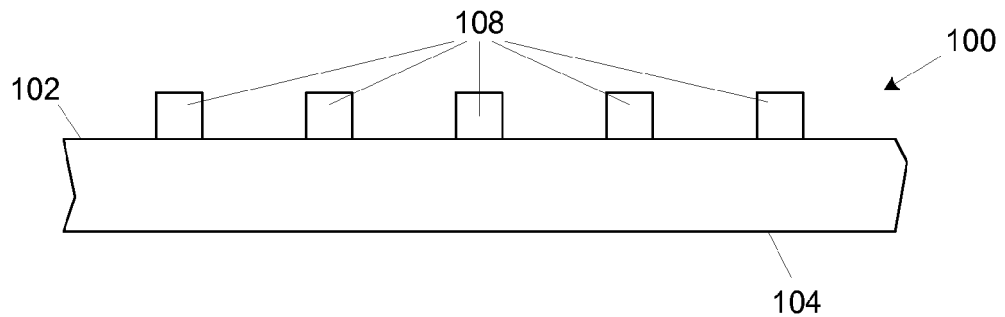
FIGS. 1-4 illustrate side cross-sectional views of a method of fabricating a microelectronic structure, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to methods for attaching a microelectronic device to a microelectronic substrate with interconnection structures after disposing of an underfill material on the microelectronic device. As filler particless within the underfill material can be trapped between the interconnection structures and bond lands on the microelectronic substrate, methods of the present description repel the filler particles away from the interconnection structures prior to connecting the microelectronic device to the microelectronic structure. These methods may include inducing a charge on the interconnection structures and may include placing the interconnection structures between opposing plates and producing an electrical bias between the opposing plates after depositing the underfill material on the interconnection structures.

FIGS. 1-4 illustrate a method of fabricating a microelectronic structure, according to one embodiment of the present description. As shown in FIG. 1, at least one microelectronic device 100 may be fabricated or provided, wherein the microelectronic device 100 may include an active surface 102 and an opposing back surface 104. At least one interconnection structure 108 may extend from the microelectronic device active surface 102. The microelectronic device interconnection structures 108 may be any appropriate material, including, but not limited to, copper and alloys thereof.

As will be understood to those skilled in the art, the microelectronic device interconnection structures 108 may be electrically connected to integrated circuitry (not shown) within the microelectronic device 100. The microelectronic device 100 may be formed from any appropriate material, including, but not limited to silicon, germanium, silicon-germanium or III-V compound semiconductor material, and may include a silicon-on-insulator substrate. The microelectronic device 100 may be any appropriate microelectronic structure, including, but not limited to, microelectronic wafer having a plurality of microelectronic dice thereon, multiple microelectronic dice cut from a microelectronic wafer, a single microelectronic die, or a microelectronic package having single or multiple microelectronic dice incorporated therein. The microelectronic die may include, but is not limited to, a microprocessor, a multichip package, a chipset, a graphics device, a wireless device, a memory device, an application specific integrated circuit device, and the like. For the sake of brevity and conciseness, the internal structures and routing layers of the microelectronic device 100 are not illustrated, but are well known to those skilled in the art.

Figure 2:
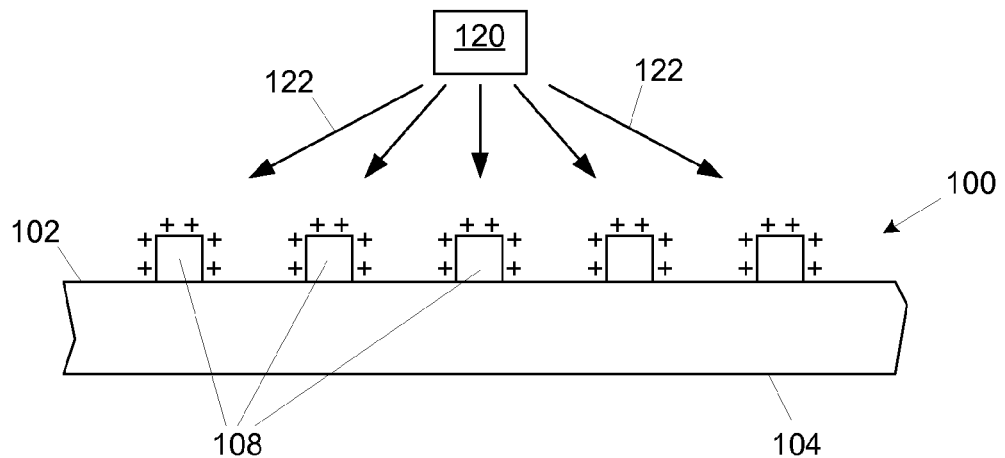

As shown in FIG. 2, a charge (illustrated as plus symbols "+" proximate the microelectronic device interconnection structures 108) may be induced on the microelectronic device interconnection structures 108. The charge + may be induced by any technique known in the art. In one embodiment of the present description, the charge + may be on the microelectronic device interconnection structures 108 by exposing them to x-ray radiation (illustrated as arrows 122) from an x-ray source 120. This process may knock off core level electrons from the material used to form the microelectronic device interconnection structures 108, such as copper or alloys thereof, thereby leaving them positively charged, as will be understood to those skilled in the art. In one embodiment, a charge + of as high as 100 volts can be obtained.

Figure 3:
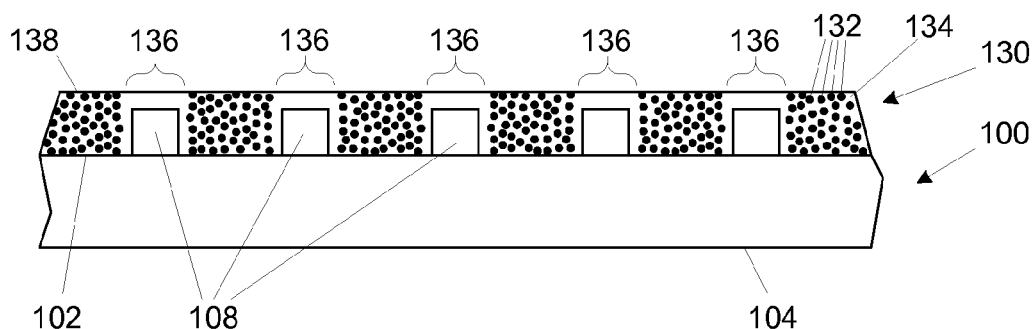

As shown in FIG. 3, an underfill material 130 may be disposed over the microelectronic device active surface 102 and the at least one microelectronic device interconnection structure 108, wherein the underfill material 130 may include filler particles 132 (illustrated generically as "dots") dispersed within a carrier 134, such as a resin material, including but not limited to Bisphenol A, Bisphenol F, and the like, which may be in mixed with a hardener material, such as an amine hardener. The filler particles 132 may be any appropriate material, including but not limited to amorphous silica and alumina, which may have an inherent positive charge. Thus, the filler particles 132 may be repelled away from the positively charged microelectronic device attachment structures 108, to form a substantially "filler free" region 136 between the microelectronic device interconnection structures 108 and an outer surface 138 of the underfill material 130 (opposing the microelectronic device active surface 102.

The underfill material 130 may be disposed over the microelectronic device active surface 102 and the at least one microelectronic device interconnection structure 108 by any technique known in the art, including, but not limited to, spin coating. After deposition of the underfill material 130, it may be partially cured, and may be planarized, if required. It is understood that if this process is executed across a semiconductor wafer, individual or multiple microelectronic dice may be singulated therefrom at this point.

Figure 4:
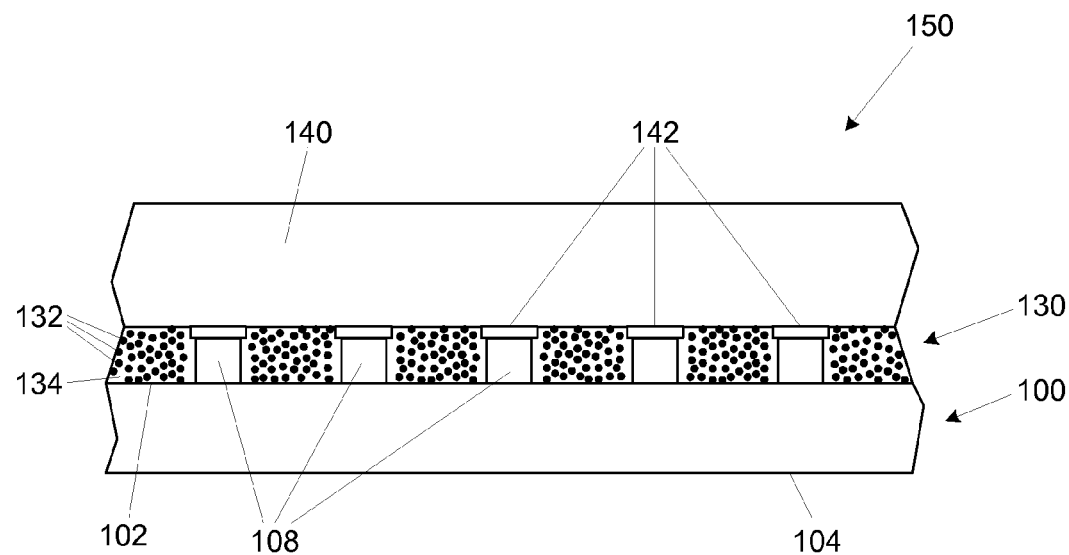

As shown in FIG. 4, the microelectronic device interconnection structures 108 may attached to a respective bond lands 142 on a microelectronic substrate 140 to form a microelectronic structure 150. The microelectronic substrate 140 may be any appropriate microelectronic component, such as a printed circuit board, motherboard, or an interposer, which may provide electrical communication routes (not shown) between the microelectronic device 100 and external components (not shown). Furthermore, the microelectronic substrate 140 may be another microelectronic device, such as microelectronic device 100, wherein the microelectronic substrate bond lands 142 may be connected to through-silicon vias (not shown), as will be understood to those skilled in the art.

Figure 5:
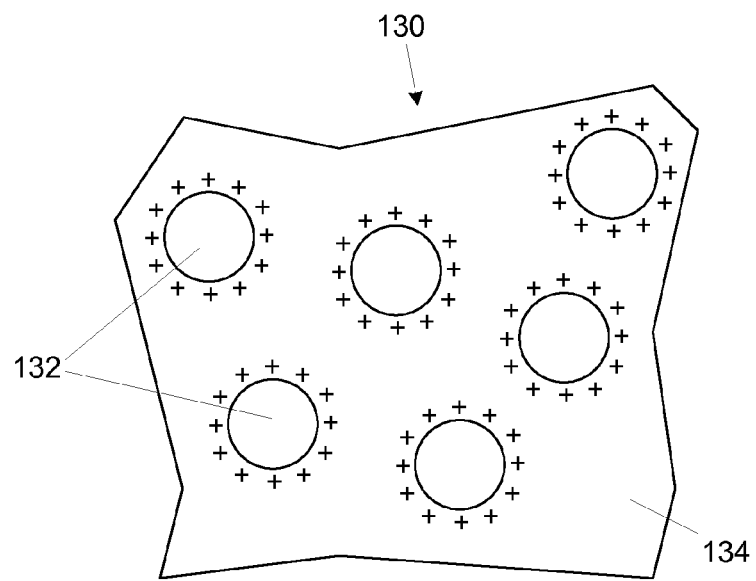
FIG. 5 illustrates a side cross-sectional views of an underfill material having charged filler particles within a carrier material, according to one embodiment of the present description.

It is understood that only a limited surface charge can be imparted on the microelectronic device interconnection structures 108, which may not be sufficient to repel the filler particles 132. Thus, in a further embodiment, surface modification can be performed on the filler particles 132 to increase their inherent positive charge prior to disposing an underfill material 130 over the microelectronic device active surface 102 and the at least one microelectronic device interconnection structure 108. As shown in FIG. 5, in one embodiment, the surface modification can include inducing a positive charge on the filler particles 132 (illustrated as plus symbols "+" proximate the filler particles 132), such as by placing the underfill material 130 under an electrical bias prior to disposing an underfill material 130 over the microelectronic device active surface 102 and the at least one microelectronic device interconnection structure 108. This surface modification may increase the repulsion force between the microelectronic device interconnection structures 108 and the filler particles 132.

In a further embodiment, if excess residual charge remains on the at least one microelectronic device interconnection structure 108 and/or the filler particles 132, it may be optionally removed. In one embodiment, the microelectronic structure 150 (see FIG. 4) may be subjected to an air ionizer, which will remove the excess residual charge without physically contacting the microelectronic structure 150 (see FIG. 4).

Figure 6:
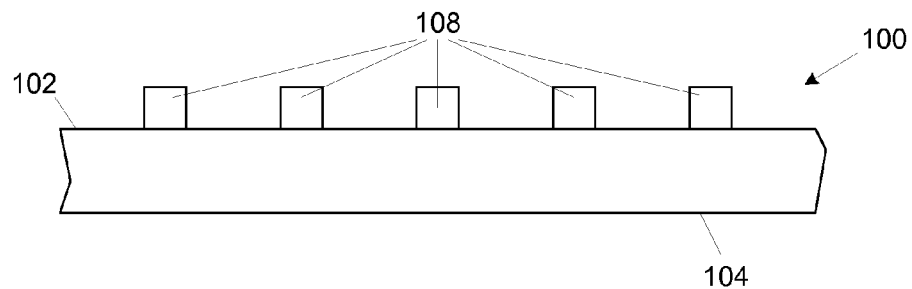
FIGS. 6-8 illustrate side cross-sectional views of a method of fabricating a microelectronic structure, according to another embodiment of the present description.
Figure 7:
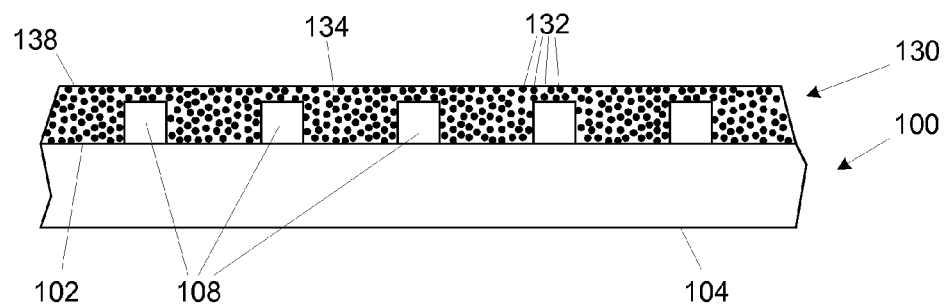
Figure 8:
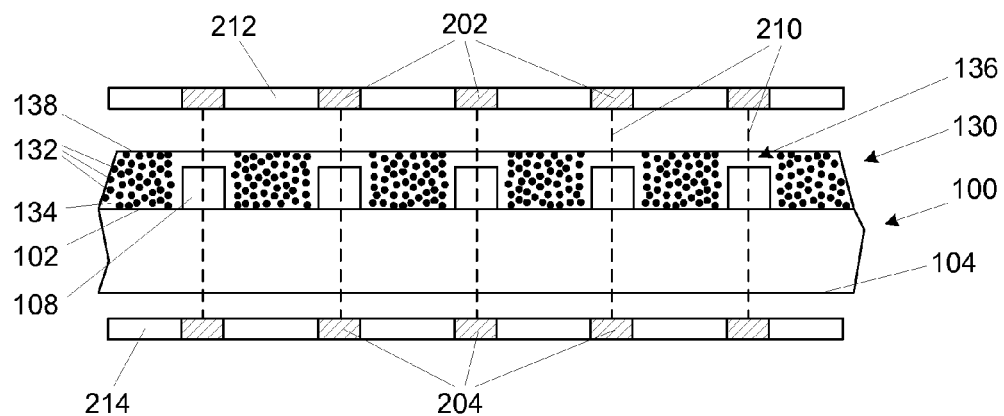

FIGS. 6-8 illustrate a method of fabricating a microelectronic structure, according to another embodiment of the present description. As shown in FIG. 6, the at least one microelectronic device 100 may be fabricated or provided, such as previously described with regard to FIG. 1, wherein the microelectronic device 100 may include the microelectronic device active surface 102 and the opposing microelectronic back surface 104. At least one interconnection structure 108 may extend from the microelectronic device active surface 102.

As shown in FIG. 7, the underfill material 130 may be disposed over the microelectronic device active surface 102 and the at least one microelectronic device interconnection structure 108. As shown in FIG. 8, the filler particles 132 of the underfill material 130 may be repelled to form the substantially "filler free" region 136 between the microelectronic device interconnection structures 108 and the underfill material outer surface 138 by positioning at least one first metal plate 202 proximate the microelectronic device active surface 102 and at least one second metal plate 204 proximate the microelectronic device back surface 104, and inducing an electrical bias (illustrated as dash lines 210) between the at least one first metal plate 202 and the corresponding at least one second metal plate 204. In one embodiment, each microelectronic device interconnection structure 108 may be position between its respective patterned first metal plate 202 and its patterned second metal plate 204. In a further embodiment, the first metal plates 202 may be retained in a first frame 212 and the second metal plates 204 may be retained in a second frame 214.

Figure 9:
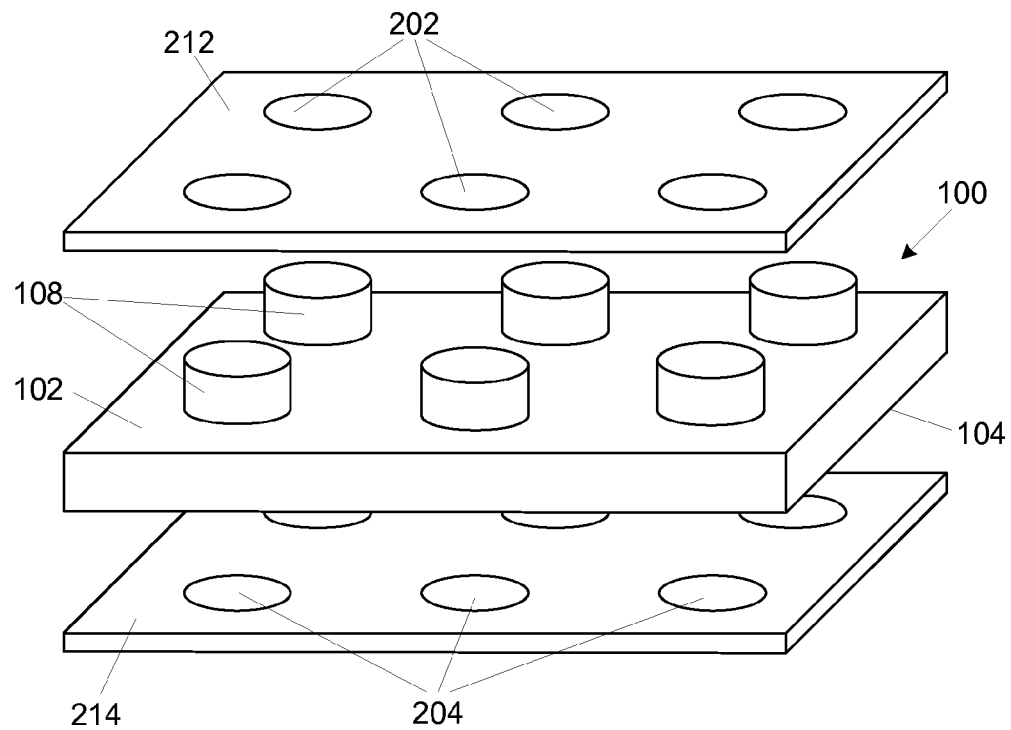
FIG. 9 illustrates an oblique view of the structure illustrated in FIG. 8, according to an embodiment of the present description.

In one embodiment, the first metal plates 202 and/or the second metal plates 204 may have substantially the same cross-sectional shape as the microelectronic device interconnection structures 108. For example, as shown in FIG. 9, the first metal plates 202 may be substantially circular, which corresponds to substantially circular microelectronic device interconnection structures 108 and substantially circular second metal plates 204, wherein the first metal plates 202 and/or the second metal plates 204 are positioned to substantially match a pattern of the microelectronic device interconnection structures 108. It is noted that the underfill material 130 is not illustrated in FIG. 9 for the purpose of clarity.

As previously discussed, the underfill material 130 may be disposed over the microelectronic device active surface 102 and the at least one microelectronic device interconnection structure 108 by any technique known in the art, including, but not limited to, spin coating. After deposition of the underfill material 130, it may be partially cured, and may be planarized, if required. It is understood that if this process is executed across a semiconductor wafer, individual or multiple microelectronic dice may be singular therefrom at this point.

After the formation of the filler free zone 138, the microelectronic device interconnection structures 108 may attached to their respective bond lands 142 on a microelectronic substrate 140 to form the microelectronic structure 150, as shown in FIG. 5. As previously discussed, surface modification can be performed on the filler particles 132 to increase their inherent positive charge prior to or after disposing the underfill material 130 over the microelectronic device active surface 102 and the at least one microelectronic device interconnection structure 108, and before repelling the filler particles 132 to from the filler free zone 138. This surface modification may increase the repulsion force between the electrical bias 210 and the filler particles 132.

As previously discussed, in a further embodiment, if excess residual charge remains after the formation of the filler free zones 138, it may be optionally removed.

Figure 10:
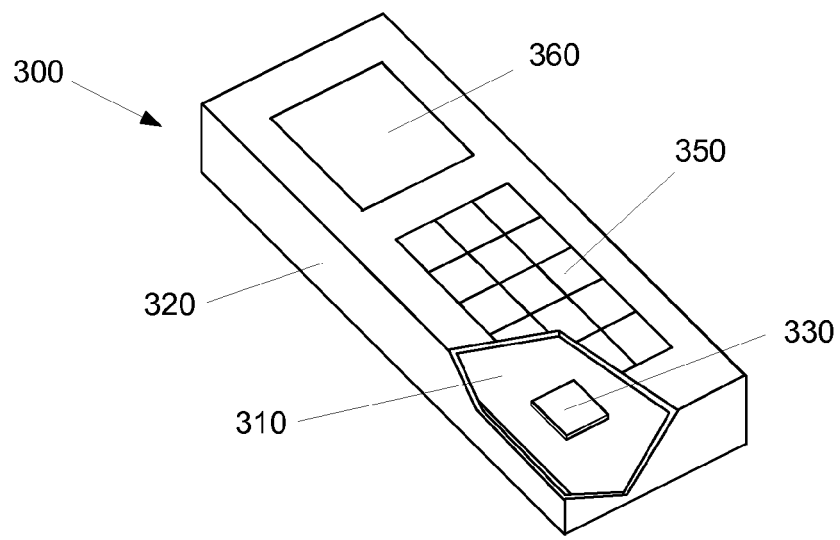
FIG. 10 illustrates an electronic system, according to one embodiment of the present description.

FIG. 10 illustrates an embodiment of an electronic system/device 300, such as a portable computer, a desktop computer, a mobile telephone, a digital camera, a digital music player, a web tablet/pad device, a personal digital assistant, a pager, an instant messaging device, or other devices. The electronic system/device 300 may be adapted to transmit and/or receive information wirelessly, such as through a wireless local area network (WLAN) system, a wireless personal area network (WPAN) system, and/or a cellular network. The electronic system/device 300 may include a microelectronic motherboard or substrate 310 disposed within a device housing 320. The microelectronic motherboard/substrate 310 may have various electronic components electrically coupled thereto, including a microelectronic device, wherein the microelectronic device is attached to the microelectronic motherboard/substrate in the manner described in the present description (see FIGS. 1-9). The microelectronic device and its constituent components are shown generically as element 330. The microelectronic motherboard/substrate 310 may be attached to various peripheral devices including an input device 350, such as keypad, and a display device 360, such an LCD display. It is understood that the display device 360 may also function as the input device, if the display device 360 is touch sensitive.

Figure 11:
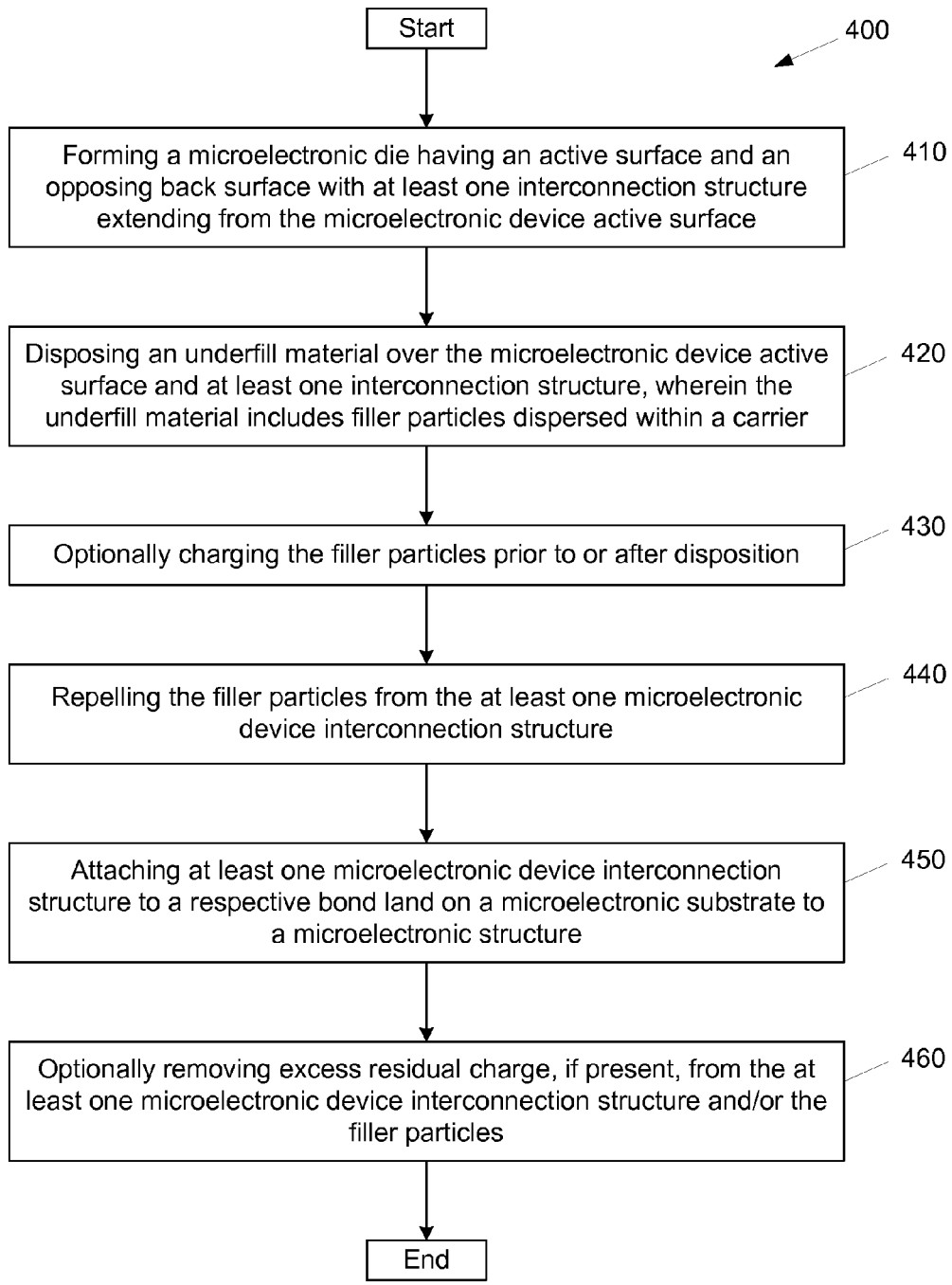
FIG. 11 is a flow chart of a process of forming a microelectronic substrate, according to an embodiment of the present description.

FIG. 11 is a flow chart of a process 400 of fabricating a microelectronic structure according to the various embodiments of the present description. As set forth in block 410, a microelectronic device may be formed having an active surface and an opposing back surface with at least one interconnection structure extending from the microelectronic device active surface. An underfill material may be disposed over the microelectronic device active surface and the at least one microelectronic device interconnection structure, wherein the underfill material includes filler particles dispersed within a carrier, as set forth in block 420. As set forth in block 430, the filler particles may be optionally charged prior to or after disposition. As set forth in block 440, the filler particles may be repelled from the at least one microelectronic device interconnection structure. The at least one microelectronic device interconnection structure may be attached to a respective bond land on a microelectronic substrate to form a microelectronic structure, as set forth in block 450. As set forth in block 460, if present, excess residual charge may be optionally removed from the at least one microelectronic device interconnection structure and/or the filler particles.

The following examples pertain to further embodiments, wherein Example 1 is a method comprising providing a microelectronic device having an active surface and an opposing back surface with at least one interconnection structure extending from the microelectronic device active surface; disposing an underfill material over the microelectronic device active surface and the at least one microelectronic device interconnection structure which forms an outer surface opposing the microelectronic device active surface, wherein the underfill material includes filler particles dispersed within a carrier material; and repelling the filler particles within the carrier material from between the at least one microelectronic device interconnection structure and the underfill material outer surface.

In Example 2, the subject matter of Example 1 can optionally include attaching the at least one microelectronic device interconnection structure to a respective bond land on a microelectronic substrate.

In Example 3, the subject matter of any of Examples 1 to 2 can optionally include repelling the filler particles by inducing a charge on the at least one microelectronic device interconnection structure.

In Example 4, the subject matter of Example 3 can optionally include inducing the charge on the at least one microelectronic device interconnection structure comprising exposing the at least one microelectronic device interconnection structure to x-ray radiation.

In Example 5, the subject matter of any of Examples 3 to 4 can optionally include inducing the charge on the at least one microelectronic device interconnection structure prior to disposing the underfill material over the microelectronic device active surface and the at least one microelectronic device interconnection structure.

In Example 6, the subject matter of any of Examples 1 to 5 can optionally include removing excess residual charge from the microelectronic device interconnection structures.

In Example 7, the subject matter of Example 1 can optionally include repelling the filler particles comprising positioning at least one first metal plate proximate the microelectronic device active surface and at least one second metal place proximate the microelectronic device back surface and inducing an electrical bias between the at least one first metal plate and the at least one second metal plate, wherein the at least one microelectronic device interconnection structure is positioned between its respective patterned first metal plate and patterned second metal plate.

In Example 8, the subject matter of Example 7 can optionally include the at least one first metal plate and the at least one second metal plate having substantially the same cross-sectional shape as the at least one microelectronic device interconnection structure.

In Example 9, the subject matter of any of Examples 7 to 8 can optionally include the at least one microelectronic device interconnection structures comprising a plurality of microelectronic device interconnection structures and the at least one first metal plate comprising a plurality of first metal plates, wherein the plurality of first metal plates are positioned to substantially match a pattern of the plurality of microelectronic device interconnection structures.

In Example 10, the subject matter of any of Examples 7 to 9 can optionally include the at least one microelectronic device interconnection structures comprising a plurality of microelectronic device interconnection structures and the at least one second metal plate comprising a plurality of second metal plates, wherein the plurality of second metal plates are positioned to substantially match a pattern of the plurality of microelectronic device interconnection structures.

In Example 11, the subject matter of any of Examples 7 to 10 can optionally include removing excess residual charge from the microelectronic device interconnection structures resulting from the electrical biasing between the at least one first metal plate and the at least one second metal plate.

In Example 12, the subject matter of any of Examples 7 to 11 can optionally include inducing a charge on the filler particles.

In Example 13, the subject matter of Example 12 can optionally include inducing the charge on the filler particles prior to disposing an underfill material over the microelectronic device active surface and the at least one microelectronic device interconnection structure.

In Example 14, the subject matter of any of Examples 12 and 13 can optionally include removing excess residual charge from the filler particles.

The following examples pertain to further embodiments, wherein Example 15 is a method comprising providing a microelectronic device having an active surface and an opposing back surface with at least one interconnection structure extending from the microelectronic device active surface; inducing a charge on the microelectronic device interconnection structure; disposing an underfill material over the microelectronic device active surface and the at least one microelectronic device interconnection structure, wherein the underfill material includes filler particles dispersed within a carrier material, and wherein the charge induced on the filler repels the filler particles from the at least one microelectronic device interconnection structure.

In Example 16, the subject matter of Example 15 can optionally include inducing the charge on the at least one microelectronic device interconnection structure by exposing the at least one microelectronic device interconnection structure to x-ray radiation.

In Example 17, the subject matter of any of Examples 15 and 16 can optionally include inducing the charge on the at least one microelectronic device interconnection structure occurs prior to disposing an underfill material over the microelectronic device active surface and the at least one microelectronic device interconnection structure.

In Example 18, the subject matter of any of Examples 15 to 17 can optionally include inducing a charge on the filler particles.

In Example 19, the subject matter of Example 18 can optionally include inducing the charge on the filler particles comprising inducing the charge on the filler particles prior to disposing an underfill material over the microelectronic device active surface and the at least one microelectronic device interconnection structure.

The following examples pertain to further embodiments, wherein Example 20 is a method comprising providing a microelectronic device having an active surface and an opposing back surface with at least one interconnection structure extending from the microelectronic device active surface; disposing an underfill material over the microelectronic device active surface and the at least one microelectronic device interconnection structure, wherein the underfill material includes filler particles dispersed within a carrier material; and repelling the filler particles from the at least one microelectronic device interconnection structure by positioning at least one first metal plate proximate the microelectronic device active surface and at least one second metal place proximate the microelectronic device back surface and inducing a bias between the plates, wherein each microelectronic device interconnection structure is position between its respective patterned first metal plate and patterned second metal plate.

In Example 21, the subject matter of Example 20 can optionally include the at least one first metal plate and the at least one second metal plate having substantially the same cross-sectional shape as the at least one microelectronic device interconnection structure.

In Example 22, the subject matter of any of Examples 20 and 21 can optionally include the at least one microelectronic device interconnection structures comprising a plurality of microelectronic device interconnection structures and the at least one first metal plate comprising a plurality of first metal plates, wherein the plurality of first metal plates are positioned to substantially match a pattern of the plurality of microelectronic device interconnection structures.

In Example 23, the subject matter of any of Examples 20 to 22 can optionally include the at least one microelectronic device interconnection structures comprising a plurality of microelectronic device interconnection structures and the at least one second metal plate comprising a plurality of second metal plates, wherein the plurality of second metal plates are positioned to substantially match a pattern of the plurality of microelectronic device interconnection structures.

In Example 24, the subject matter of any of Examples 20 to 23 can optionally include inducing a charge on the filler particles.

In Example 25, the subject matter of Example 24 can optionally include inducing the charge on the filler particles comprising at least one of inducing a charge on the filler particles prior to disposing an underfill material over the microelectronic device active surface and the at least one microelectronic device interconnection structure, and inducing the charge on the filler particles after disposing an underfill material over the microelectronic device active surface and the at least one microelectronic device interconnection structure, and before repelling the filler particles from the at least one microelectronic device interconnection structure.

It is understood that the subject matter of the present description is not necessarily limited to specific applications illustrated in FIGS. 1-11. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method, comprising:
providing a microelectronic device having an active surface and an opposing back surface with at least one interconnection structure extending from the microelectronic device active surface;
disposing an underfill material over the microelectronic device active surface and the at least one microelectronic device interconnection structure, wherein the underfill material includes filler particles dispersed within a carrier material; and
repelling the filler particles from the at least one microelectronic device interconnection structure by positioning at least one first metal plate proximate the microelectronic device active surface and at least one second metal place proximate the microelectronic device back surface and inducing a bias between the plates, wherein each microelectronic device interconnection structure is position between its respective patterned first metal plate and patterned second metal plate.

2. The method of claim 1, wherein the at least one first metal plate and the at least one second metal plate have substantially the same cross-sectional shape as the at least one microelectronic device interconnection structure.

3. The method of claim 1, wherein the at least one microelectronic device interconnection structures comprises a plurality of microelectronic device interconnection structures and the at least one first metal plate comprises a plurality of first metal plates, wherein the plurality of first metal plates are positioned to substantially match a pattern of the plurality of microelectronic device interconnection structures.

4. The method of claim 3, wherein the plurality of first metal plates comprises a plurality of substantially circular first metal plates.

5. The method of claim 1, wherein the at least one microelectronic device interconnection structures comprises a plurality of microelectronic device interconnection structures and the at least one second metal plate comprises a plurality of second metal plates, wherein the plurality of second metal plates are positioned to substantially match a pattern of the plurality of microelectronic device interconnection structures.

6. The method of claim 5, wherein the plurality of second metal plates comprises a plurality of substantially circular second metal plates.

7. The method of claim 1, further comprising inducing a charge on the filler particles.

8. The method of claim 7, wherein inducing the charge on the filler particles comprises at least one of inducing the charge on the filler particles prior to disposing an underfill material over the microelectronic device active surface and the at least one microelectronic device interconnection structure.

9. The method of claim 7, wherein inducing the charge on the filler particles comprises inducing the charge on the filler particles after disposing an underfill material over the microelectronic device active surface and the at least one microelectronic device interconnection structure and before repelling the filler particles from the at least one microelectronic device interconnection structure.

10. The method of claim 1, further comprising removing excess charge for the at least one microelectronic device interconnection structure.

11. The method of claim 10, wherein removing excess charge for the at least one microelectronic device interconnection structure comprising removing excess charge for the at least one microelectronic device interconnection structure by air ionization.

12. The method of claim 1, wherein disposing an underfill material comprises spin coating the underfill material over the microelectronic device active surface and the at least one microelectronic device interconnection structure.

13. The method of claim 1, further including partially curing and planarizing the underfill material.

14. The method of claim 1, wherein the underfill material includes filler particles dispersed within a resin carrier material.

15. The method of claim 1, wherein the underfill material includes amorphous silica filler particles dispersed within the carrier material.

16. The method of claim 1, wherein the underfill material includes alumina filler particles dispersed within the carrier material.

* * * * *